United States Patent [19]

Sasaki et al.

[11] Patent Number: 4,630,089
[45] Date of Patent: Dec. 16, 1986

[54] SEMICONDUCTOR MEMORY DEVICE

[75] Inventors: Nobuo Sasaki, Kawasaki; Yasuo Suzuki, Yokohama, both of Japan

[73] Assignee: Fujitsu Limited, Kawasaki, Japan

[21] Appl. No.: 654,701

[22] Filed: Sep. 26, 1984

[30] Foreign Application Priority Data

Sep. 27, 1983 [JP] Japan ................... 58-178473

[51] Int. Cl.⁴ .................. H01L 29/78; H01L 27/02; H01L 29/04; G11C 17/00
[52] U.S. Cl. ................. 357/23.7; 357/23.12; 357/59; 357/41; 357/23.9; 365/104
[58] Field of Search ............ 357/23.7, 23.12, 59 E, 357/41; 365/104, 103

[56] References Cited

U.S. PATENT DOCUMENTS 4,364,167 12/1982 Donley .................. 357/23
4,476,475 10/1984 Naem et al. ............ 357/23.7

OTHER PUBLICATIONS

Electronics International, vol. 56, No. 19, Sep. 1983.
IEEE Journal of Solid-State Circuits, vol. SC-17, No. 2, Apr. 1982.

Primary Examiner—Andrew J. James
Assistant Examiner—R. P. Limanek
Attorney, Agent, or Firm—Armstrong, Nikaido, Marmelstein & Kubovcik

[57] ABSTRACT

A semiconductor memory device including a first MIS transistor having source and drain regions formed in a substrate and a gate electrode provided on the substrate through an insulating layer; a semiconductor layer provided on the first MIS transistor through the insulating layer and being in contact with the source and drain regions of the first MIS transistor; a second MIS transistor having source and drain regions formed in the semiconductor layer and being in contact with the source and drain regions of the first MIS transistor and having a gate electrode provided on the semiconductor layer through an insulating layer; and a bit line being in contact with the source or drain region of the second MIS transistor and extended on the second MIS transistor; each gate electrode of the first and the second MIS transistors being connected with different word lines respectively, and impurities having an amount more than a required value being doped to at least one of the substrate and the semiconductor layer below the gate electrode of the first MIS transistor and the semiconductor.

6 Claims, 10 Drawing Figures

SEMICONDUCTOR MEMORY DEVICE

BACKGROUND OF THE INVENTION (1) Field of the Invention

The present invention relates to a semiconductor memory device, more particularly to a read-only memory (ROM) device in which information can be written through a mask, i.e., a mask ROM.

(2) Description of the Prior Art

To improve the data processing ability of semiconductor integrated circuits (IC's), it is important to increase the degree of integration of the ROM's used therein. With ROM's of a binary logic structure, however, the limit has substantially been reached in miniaturization of the composite transistors. To further increase the density of ROM's, therefore, use is now being made of so-called multivalue-logic ROM's, i.e., ROM's of a three or more value logic structure.

A multivalue-logic ROM is formed by transistors having three or more different threshold voltages. In the case of a three-value logic ROM, the transistors having a high threshold voltage, a medium threshold voltage, and a low threshold voltage. Due to the restrictions imposed by the source voltage, however, it is not possible to have a large difference between the threshold voltages of a ROM. This necessitates severe process control when forming the ROM. There are inevitable variations between the threshold voltages of different ROM's due to variations in the channel length, thickness of the gate oxidation film, dose of impurities into the channel region, heat treatment conditions, depth of the source and drain regions, and the like. This results in a loss of reliability of fixed data and a lower production yield of semiconductor IC's provided with such ROM's.

SUMMARY OF THE INVENTION

An object of the present invention is to eliminate the above-mentioned problems.

Another object of the present invention is to provide a semiconductor memory device enabling precise writing and reading in a miniaturized structure.

Still another object of the present invention is to provide a semiconductor memory device featuring improved data processing ability and increased production yield.

To attain the above-mentioned objects, according to the present invention, there is provided a semiconductor memory device including a first MIS transistor having source and drain regions formed in a substrate and a gate electrode provided on the substrate through an insulating layer; a semiconductor layer provided on the first MIS transistor through the insulating layer and being in contact with the source and drain regions of the first MIS transistor; a second MIS transistor having source and drain regions formed in the semiconductor layer and being in contact with the source and drain regions of the first MIS transistor and having a gate electrode provided on the semiconductor layer through an insulating layer; and a bit line being in contact with the source or drain region of the second MIS transistor and extended on the second MIS transistor; each gate electrode of the first and the second MIS transistors being connected with different word lines respectively, and impurities having an amount more than a required value being doped to at least one of the substrate and the semiconductor layer below the gate electrode of the first MIS transistor and the semiconductor.

BRIEF DESCRIPTION OF THE DRAWINGS

The features of the present invention will become clearer from the ensuing description of preferred embodiments made in reference to the accompanying figures, in which.

DESCRIPTION OF THE PREFERRED EMBODIMENTS

Figure 1:
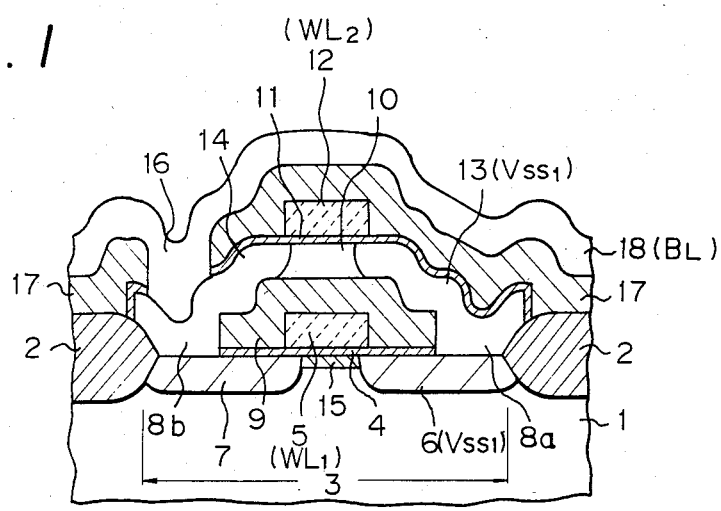
FIG. 1 is a cross-sectional view of a cell transistor of a semiconductor memory device according to an embodiment of the present invention.

FIG. 1 is a cross-sectional view of a cell transistor of a semiconductor memory according to an embodiment of the present invention.

The cell transistor shown in FIG. 1 consists of a first cell metal-oxide semiconductor (MOS) transistor and a second cell MOS transistor.

The first cell MOS transistor is positioned on a p type silicon substrate 1 and isolated by a field oxide layer 2 in a unit cell region 3 and consists of a first gate oxide layer 4, a first n+ type polycrystalline silicon gate electrode 5, a first n+ type source region 6, and a first n+ type drain region 7. The first cell transistor is covered with a silicon dioxide insulating layer 9, the layer 9 being provided with first openings 8a and 8b exposing part of the first source region 6 and the first drain region 7. The silicon dioxide insulating layer 9 has on top of it an isolated p type single crystalline silicon layer 10 which contacts the first source region 6 and the first drain region 7 through the first openings 8a and 8b.

The second cell MOS transistor is formed on the p type single crystalline layer 10. This transistor consists of a second gate oxide layer 11, a second n+ type polycrystalline silicon gate electrode 12, a second n+ type source region 13, and a second n+ type drain region 14. The regions 13 and 14 contact the regions 6 and 7 through the openings 8a and 8b, respectively.

Information is written by ion implantation to the Si-SiO$_2$ interface of the first or second MOS cell transistor. If p-type impurities such as boron are implanted to the interface, the threshold voltage of the MOS cell transistor increases. The selective implantation to the first or the second MOS cell transistor is performed by changing the accelerating energy. The region 15 shows the implanted layer in silicon substrate of the Si-SiO$_2$ interface in this writing operation for the first MOS cell transistor.

The cell transistor is covered with an insulating layer 17 consisting of, for example, phosphosilicate glass and having an opening 16 exposing part of the second n+ type drain region 14. On the insulating layer 17 is provided an aluminum wiring 18 which acts as a bit line (BL), which aluminum wiring 18 is connected to the first n+ drain region 7 through the second n+ type drain region 14.

The first and second n+ type polycrystalline silicon gate electrodes 5 and 12 act as different word lines WL$_1$ and WL$_2$. The first n+ type source region 6 and the second n+ type source region 13, which contacts the first n+ type source region 6, are electrically connected to a common grounding conductor V$_{SS1}$.

The process for the production of the cell transistor of the semiconductor memory device according to the above embodiment of the present invention will now be explained. FIGS. 2A to 2F are cross-sectional views of the process.

Figure 2A:
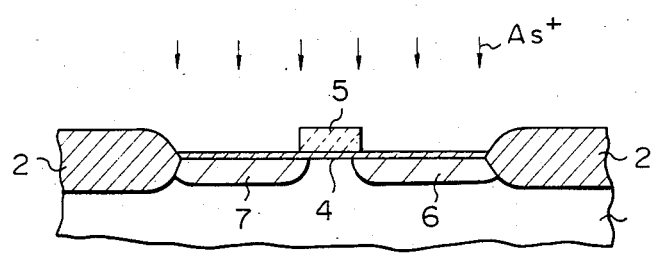
FIGS. 2A to 2F are cross-sectional views of a process for the production of the cell transistor of FIG. 1.

As shown in FIG. 2A, the field oxide layer 2 having a thickness of 6000 Å is formed on the p-type silicon substrate 1 having a specific resistance of about 10 ohm-cm by a usual selective oxidation process. On this isolated p type silicon substrate 1, the first gate oxide layer 4, having a thickness of, for example, 300 Å is formed by a usual thermal oxidation process. A polycrystalline silicon layer having a thickness of, for example, 4000 Å is laid over the p type silicon substrate 1 by a usual chemical vapor deposition (CVD) process. The polycrystalline silicon layer is then patterned by a photolithography technique to form the first polycrystalline silicon gate electrode 5. Using the first polycrystalline silicon gate electrode 5 as a mask, n type impurities, for example, arsenic ions, are selectively implanted into the p type silicon substrate 1 at an energy of 100 keV and to a dosage of $2 \times 10^{15}$ atoms per cm$^2$. The required annealing process is then performed to form the first n+ type source region 6 and the first n+ type drain region 7, having a high impurity concentration of $10^{20}$ atoms per cm$^3$ or more, whereby the first polycrystalline silicon gate electrode 5 simultaneously becomes an n+ type electrode having a high impurity concentration of $10^{20}$ atoms per cm$^3$ or more. Thus, the first cell MOS transistor is formed.

Figure 2B:
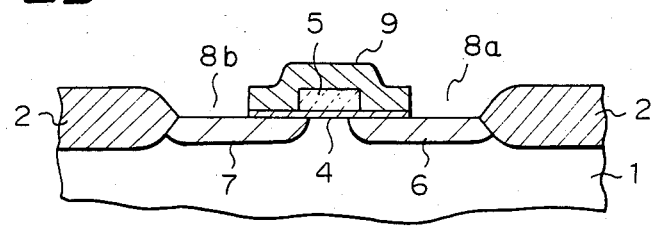

As shown in FIG. 2B, a silicon dioxide insulating layer having a thickness of, for example, 4000 Å is formed on the obtained substrate. The silicon dioxide layer is patterned by a photolithography technique to form the silicon dioxide insulating layer 9 and expose part of the first source and drain regions 6 and 7 through the openings 8a and 8b. The insulating layer 9 may also be formed by a two-layer structure consisting of a lower layer of phosphosilicate glass and an upper layer of silicon dioxide to improve the flatness over the polycrystalline silicon layer.

Figure 2C:
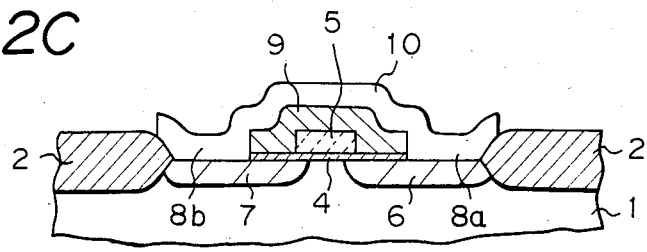

As shown in FIG. 2C, a p type polycrystalline silicon layer having a required impurity concentration and thickness of, for example, 4000 Å is formed on the obtained substrate by the CVD process. The polycrystalline silicon layer is then recrystallized by the scanning of, for example, an argon laser beam at a laser power of 4 W, a laser beam spot radius of 30 micrometers, a scanning speed of 3 cm/sec, and a substrate temperature of 450° C. After the recrystallization of the polycrystalline silicon layer, the recrystallized silicon layer is patterned by photolithography to form a silicon island 10. The island 10 is connected to the n+ type source and drain regions 6 and 7 at the first openings 8a and 8b.

Figure 2D:
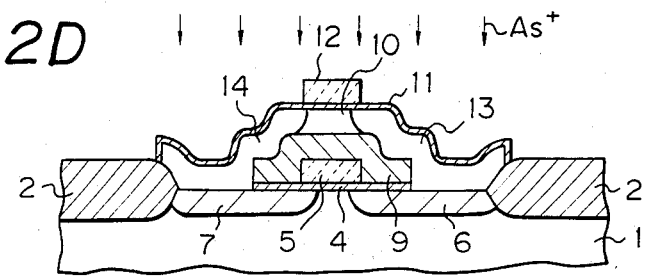

As shown in FIG. 2D, the second gate oxide layer 11, having a thickness of, for example, 300 Å is formed on the surface of the recrystallized silicon island 10 by a usual thermal oxidation process. A polycrystalline silicon layer having a thickness of, for example, 4000 Å, is deposited by the CVD process. The polycrystalline silicon layer is then patterned by photolithography to form the second polycrystalline silicon gate electrode 12. Using the second polycrystalline silicon gate electrode 12 as a mask, n type impurities, for example, arsenic ions, are selectively implanted into the recrystalline silicon island 10 at an energy of 100 keV and to a dosage of $2 \times 10^{15}$ atoms per cm$^2$. An annealing process is then performed to form the second n+ type source region 13 and the second n+ type drain n 14, having a high impurity concentration of $10^{20}$ atoms per or more, whereby the second polycrystalline silicon gate electrode 12 simultaneously becomes an n+ type electrode having a high impurity concentration of $10^{20}$ atoms per cm$^3$ or more. Thus, the second cell MOS transistor is formed.

Figure 2E:
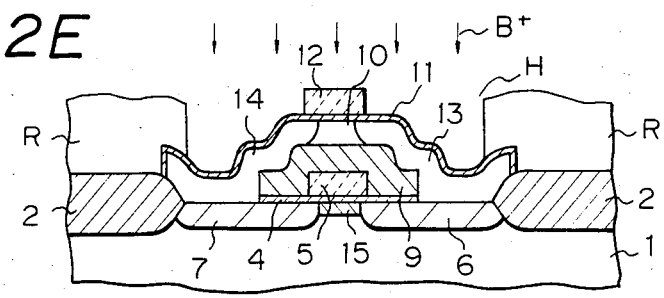

As shown in FIG. 2E, a resist layer R is formed on the obtained substrate. The resist layer R is patterned to form an opening H exposing the cell transistors to which information is to be written. Then, for example, boron ions are selectively implanted through the opening H into the first cell transistor at an energy of 800 KeV and to a dosage of about $2 \times 10^{13}$ atoms per cm$^2$ through the second MOS cell transistor. An annealing process is thhen carried out to activate implanted species, whereby the implanted layer 15 raises the threshold voltage of the first MOS cell transistor. In the above ion implantation process, the projection range R$_p$ of the implantation depth of boron ions in the energy of about 800 KeV is 1.5 micrometers. The standard deviation of the implanted boron ions is approximately 0.1 micrometer. The total thickness of the layers is approximately 1.66 micrometers. Thus, the electrical characteristics of the second MOS cell transistor does not change and an amount of boron ions sufficient to increase the threshold voltage is implanted into the portion under the first polycrystalline gate electrode 5. It should be noted that the 800 KeV boron ions can be obtained at an accelerating voltage of 400 kV if B++ ions are used.

The threshold voltage of the second MOS cell transistor is raised by the boron ion implantation process at an energy of about 150 KeV. Since the channel regions of the first and second MOS cell transistors are spaced apart by the silicon dioxide insulating layer 9 at a distance of 4000 Å in the direction of depth, information can be selectively written in the first MOS cell transistors.

In the above implantation step, boron ions are also implanted into the first and second n+ source and drain regions, however, since the dosage of boron ions is small, there is no problem as to the conversion of the n type to the p type.

Figure 2F:
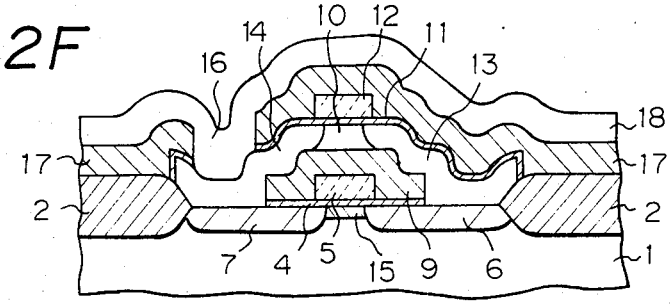

As shown in FIG. 2F, the insulating layer 17, of, for example, phosphosilicate glass, is deposited by the CVD process to a thickness of 6000 Å. An opening 16 exposing the second n+ type drain region 14 is formed in the insulating layer 17 by the photolithography technique. An aluminum layer 18 is evaporated by a usual vapor deposition process or sputtering process. The aluminum layer is patterned to form aluminum wiring acting as a bit line, which contacts the second n+ drain region 14 at the opening 16. Then, a passivation layer (not shown) is formed on the obtained structure.

Figure 3:
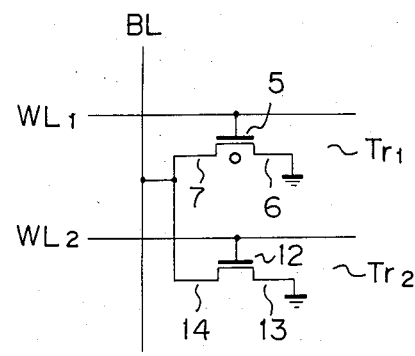
FIG. 3 is a view of an equivalent circuit of a unit cell of a semiconductor memory device according to an embodiment of the present invention.

FIG. 3 is a view of an equivalent circuit of a unit cell according to the present invention. In FIG. 3, Tr$_1$ indicates the first MOS cell transistor, in which information is written by ion implantation through the second MOS cell transistor. On the other hand, Tr$_2$ indicates the second MOS cell transistor, in which information is also written by ion implantation; the second MOS cell transistor formed on the upper part of the structure of the present memory device and comprising the second n+ type polycrystalline silicon gate electrode 12, the second n+ type source region 13, and the second n+ type drain region 14. BL indicates the bit line, $WL_1$ the lower word line constituted by the gate electrode of the first MOS cell transistor, and $WL_2$ the upper word line constituted by the gate electrode of the second MOS cell transistor.

As can be seen from the above, in the unit cell of the present memory device, binary information can be stored in each of the first and second MOS cell transistors.

Figure 4:
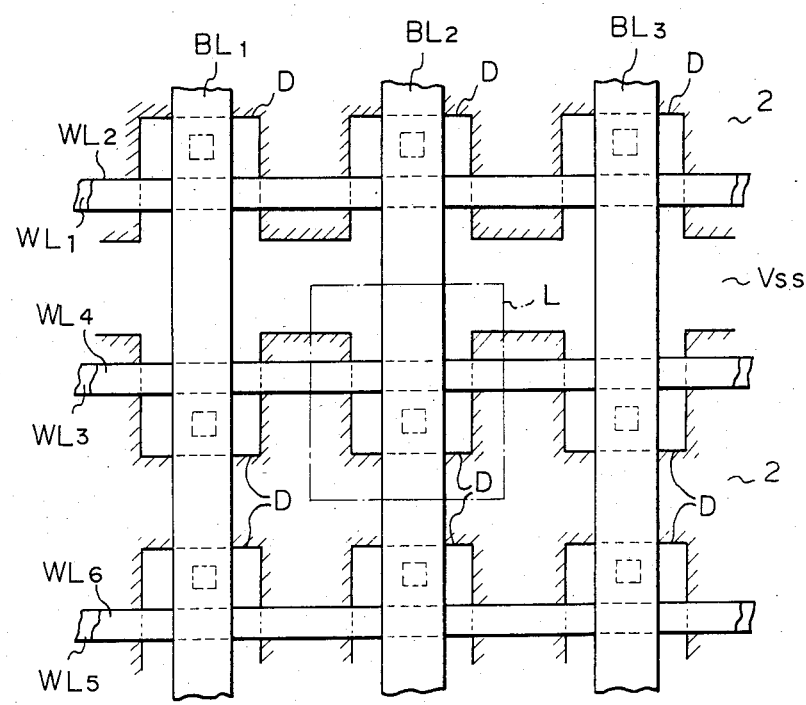
FIG. 4 is a schematic plan view of an arrangement of a plurality of the unit cells.

FIG. 4 is a schematic plan view of an arrangement of a plurality of the unit cells. In FIG. 4, the region surrounded by the line L shows one of the unit cells mentioned above. The amount of information stored in the cell region is twice that of a region of the same area in the prior art, namely, the degree of integration is doubled. In FIG. 4, $WL_1$ to $WL_6$ indicate word lines, $BL_1$ to $BL_3$ bit lines, and $V_{SS}$ and D a ground line and first and second drain regions. Reference numeral 2 indicates a field oxide layer.

Figure 5:
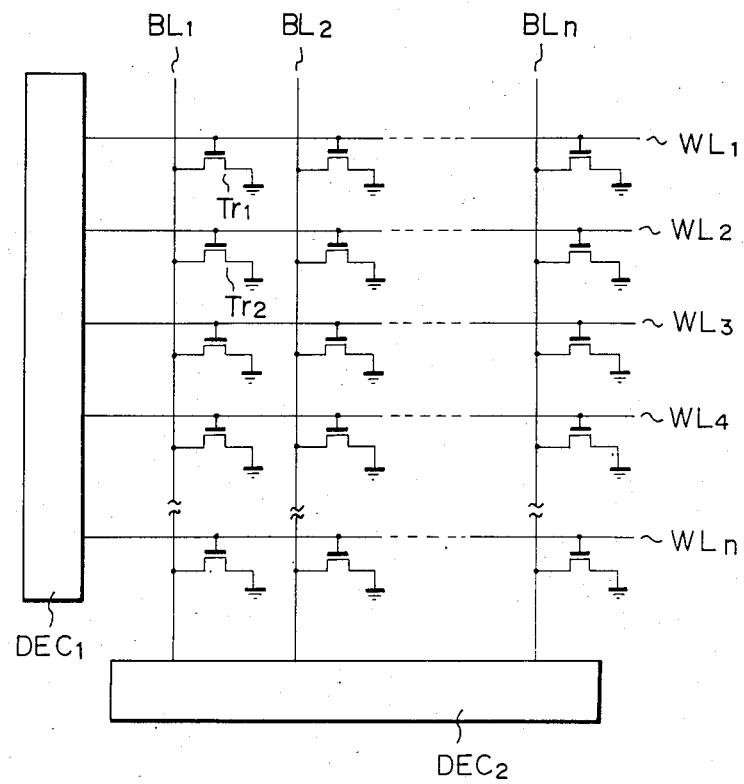
FIG. 5 is a view of an equivalent circuit of a semiconductor memory device according to an embodiment of the present invention.

FIG. 5 is a view of an equivalent circuit according to the present invention. In FIG. 5, for example, $WL_1$ and $WL_2$ are arranged in the same line, but $WL_1$ is electrically connected to the first MOS cell transistor and $WL_2$ to the second MOS cell transistor. $WL_3$ and $WL_4$ are also arranged in the same line next to the above line, but $WL_3$ is electrically connected to the first MOS cell transistor and $WL_4$ to the second MOS cell transistor. Further, $DEC_1$ and DEC' show a decoder for selecting words and bits, respectively.

We claim:

1. A semiconductor memory device comprising:
    a first MIS transisor having source and drain regions formed in a substrate and a first gate electrode provided on the substrate through an insulating layer;
    a semiconductor layer provided on the first MIS transistor through the insulating layer and being in contact with the source and drain regions of the first MIS transistor;
    a second MIS transistor having a second gate electrode provided on the semiconductor layer and having source and drain regions formed in the semiconductor layer and being in contact with the source and drain regions of the first MIS transistor and having a gate electrode provided on the semiconductor layer through an insulating layer; and
    a bit line being in contact with the source or drain region of the second MIS transistor and extended on the second MIS transistor;
    each gate electrode of the first and the second MIS transistors being connected with different word lines respectively.

2. A device according to claim 1, wherein said given conductivity type semiconductor substrate is a p type semiconductor substrate.

3. A device according to claim 1, wherein high concentration impurities are implanted into either said semiconductor substrate or said semiconductor layer under said gate electrodes.

4. A device according to claim 3, wherein said implantation of high concentration impurities is carried out by using boron ions of a dosage of about $2 \times 10^{13}$ atoms per $cm^2$ at an energy of about 800 KeV.

5. A device according to claim 1, wherein low concentration impurities are implanted into either said semiconductor substrate or said semiconductor layer under said gate electrodes.

6. A device according to claim 5, wherein said implantation of low concentration impurities is carried out by using boron ions of a dosage of about $2 \times 10^{13}$ atoms per $cm^2$ at an energy of about 150 KeV.

* * * * *